(12) United States Patent
Medelius et al.

(10) Patent No.: US 6,462,684 B1
(45) Date of Patent: Oct. 8, 2002

(54) ADVANCED SELF-CALIBRATING, SELF-REPAIRING DATA ACQUISITION SYSTEM

(75) Inventors: Pedro J. Medelius, Merritt Island, FL (US); Anthony J. Eckhoff, Cocoa, FL (US); Lucena R. Angel, Orlando, FL (US); Jose M. Perotti, Merritt Island, FL (US)

(73) Assignee: The United States of America as represented by the Administrator of the National Aeronautics and Space Administration, Washington, DC (US)

( * ) Notice: Subject to any disclaimer, the term of this patent is extended or adjusted under 35 U.S.C. 154(b) by 0 days.

(21) Appl. No.: 10/095,344

(22) Filed: Mar. 5, 2002

Related U.S. Application Data
(60) Provisional application No. 60/322,845, filed on Sep. 7, 2001.

(51) Int. Cl.[7] ................................................ H03M 1/10
(52) U.S. Cl. ...................... 341/120; 341/155; 341/121; 341/126
(58) Field of Search ................................ 341/120, 121, 341/126, 155

(56) References Cited

U.S. PATENT DOCUMENTS

| | | | | |
|---|---|---|---|---|
| 4,380,757 | * | 4/1983 | Vancsa | 341/120 |
| 4,399,426 | * | 8/1983 | Tan | 341/120 |
| 4,546,343 | * | 10/1985 | Higgins et al. | 324/115 |
| 4,958,139 | * | 9/1990 | Hyatt | 341/139 |
| 5,138,552 | * | 8/1992 | Weedon et al. | 341/157 |
| 5,157,394 | * | 10/1992 | Bright | 341/122 |
| 5,428,357 | * | 6/1995 | Haab et al. | 341/155 |
| 5,703,584 | * | 12/1997 | Hill | 341/141 |
| 6,166,673 | * | 12/2000 | Odom | 341/155 |
| 6,232,897 | * | 5/2001 | Knusen | 341/120 |
| 6,297,760 | * | 10/2001 | Hungerbuehler et al. | 341/155 |
| 6,333,708 | * | 12/2001 | Hungerbuehler et al. | 341/155 |
| 6,356,219 | * | 3/2002 | Weibel, IV et al. | 341/120 |

OTHER PUBLICATIONS

E Series Multifunction DAQ Overview—National Instruments.
Essential Technologies for Measurements You Can Count On—National Instruments—Jan. 1998.
FieldPoint Modular Distribution I/O System.

* cited by examiner

Primary Examiner—Michael Tokar
Assistant Examiner—Lam T. Mai
(74) Attorney, Agent, or Firm—Randall M. Heald; Gary G. Borda; John G. Mannix

(57) ABSTRACT

An improved self-calibrating and self-repairing Data Acquisition System (DAS) for use in inaccessible areas, such as onboard spacecraft, and capable of autonomously performing required system health checks, failure detection. When required, self-repair is implemented utilizing a "spare parts/tool box" system. The available number of spare components primarily depends upon each component's predicted reliability which may be determined using Mean Time Between Failures (MTBF) analysis. Failing or degrading components are electronically removed and disabled to reduce power consumption, before being electronically replaced with spare components.

26 Claims, 4 Drawing Sheets

ADVANCED SELF-CALIBRATING, SELF-REPAIRING DATA ACQUISITION SYSTEM

CROSS REFERENCE TO RELATED APPLICATIONS

This application is related to and claims the benefit of the filing date of U.S. Provisional Application No. 60/322,845 filed on Sep. 7, 2001 (incorporated by reference.)

ORIGIN OF THE INVENTION

The invention described herein was made in the performance of work under a NASA contract and by employees of the United States Government and is subject to the provisions of Public Law 96-517 (35 U.S.C. §202) and may be manufactured and used by or for the Government for governmental purposes without the payment of any royalties thereon or therefore. In accordance with 35 U.S.C. §202, the contractor elected not to retain title.

BACKGROUND OF THE INVENTION

Conventional data acquisition system(s) (DAS) dealing with Analog Signal Path design architecture have long faced the problem of maintaining signal integrity with a minimum of system redundancy. In an effort to solve this problem, traditional DAS designs have required total hardware redundancy for every channel and every function block of the DAS.

In addition, the need for self-calibration and verification capability is also of great importance when formulating this type of architecture. When a DAS is utilized in a remote environment, as for example, an unmanned spacecraft, autonomous self-calibration without the need for external intervention is mandatory. To ensure the highest quality of operating performance, the DAS must remain properly calibrated for the life of the monitored process.

Finally, the ability of the DAS to perform a large number of separate diagnostic functions (e.g. system health checks, failure detection/prediction, automated self-repair) is of paramount importance in systems for which operator intervention is not an option. Remotely operating DAS systems, including operations in unmanned spacecraft, also require the ability to autonomously and automatically reconfigure their DAS when system failure and/or degradation is identified.

Designers of conventional DAS have attempted to overcome the inaccessibility problem with total hardware and software redundancy. In addition to being very costly, these approaches have added significant weight, size and power requirements to the systems they are supporting; all undesirable qualities for remote applications. Thus, the potential benefits of existing DAS have been significantly outweighed by such design redundancies. Furthermore, traditional DAS do not provide for flexibility to autonomous and automatically reconfigure upon a failure being detected.

For the reasons stated above, there currently is a need for a DAS that is more compact and economical without sacrificing any elements of the architecture necessary for performing a variety of functions.

SUMMARY OF THE INVENTION

A first aspect of the present invention provides for autonomous electronic self-repair capability and functions of the DAS that allows the system to autonomously reroute signals as required to maintain an accurate and stable operation.

A further aspect of the present invention provides for autonomous electronic health self-checks by the DAS.

A yet further aspect of the present invention is directed to a device and system self-calibration process that provides accurate measurements even under extreme environmental conditions.

Another aspect of the present invention provides for a failure detection and prediction component that continuously compares current readings with those in the DAS database (calculated and stored locally within the system) for predicting which components will be faced with imminent failure.

Another aspect of the present invention provides for data integrity and availability with reduced number of components as compared to conventional systems.

Another aspect of the present invention provides for greater power management to reduce power consumption.

The present invention achieves each of these aspects by implementing a "spare parts/tool box" system, wherein component redundancy is reduced by providing a reduced number of spare or redundant components, as compared to known a apparatus which may employ a redundant system for every operating system, i.e., one-to-one redundancy. The "spare parts/tool box" system terminology is used to better clarify the present invention, and is not in anyway indicative of a "kit-like" device. It has been determined that number and type of components needed in any given DAS is primarily dependant only upon the individual component reliability and the location of the component within the DAS. As a result, not all component types in the "tool box" have the same number of spare parts. Of particular importance is the fact that these components are interchangeable, and can replace any failed and/or degraded component of its type, regardless of its location in the DAS. Failed and/or degraded components are electronically removed from the operating system and disabled, thereby reducing power consumption. In addition, the present invention may provide for autonomous, automatic replacement of failed and/or degraded components with spare parts.

A statistical determination of those operational components more likely to fail may be determined by quantification of reliability parameters including Mean Time Between Failure (MTBF) following well established reliability guidelines. In order to predict whether a specific component may or may not fail, reliability parameters including Mean Time Between Failures (MTBF) may be utilized by following the established reliability guidelines appearing MIL-HDBK-338 "Electronic Reliability Design Handbook." In addition to MTBF parameters, Reliability programs run by the components' manufacturers (especially with Military rated product lines) may provide some of the parameters. A location factor (weighing factor) may also be calculated based on the location of a component under review. Components located in more risky areas (more likely to receive external damage) may have a higher weighing factor than those components isolated from external attack by various forces such as X-rays.

The system embodied in the present invention is directly responsive to the industry's needs, including that of the aerospace industry, to reduce operation and maintenance costs, while, at the same time, providing a reliable, economical system.

DETAILED DESCRIPTION OF THE INVENTION

The present invention overcomes the problem of performing DAS maintenance at a humanly inaccessible location by providing a unique "spare parts-tool box" system approach. The present invention identifies and assesses all areas of the DAS circuitry to identify potential reliability problems. Certain DAS areas, such as signal inputs and outputs, are generally considered high-risk, while internal areas of the DAS not exposed to external variables are considered low-risk. Specific components that may be identified as requiring modified "spare parts-tool box" system protection are considered within the scope of the present invention.

In order to predict whether a specific component may or may not fail, reliability parameters including Mean Time Between Failures (MTBF) may be utilized by following the established reliability guidelines appearing MIL-HDBK-338 "Electronic Reliability Design Handbook." In addition to MTBF parameters, Reliability programs run by the components' manufacturers (especially with Military rated product lines) may provide some of the parameters. A location factor (weighing factor) may also be calculated based on the location of a component under review. Components located in more risky areas (more likely to receive external damage) may have a higher weighing factor than those components isolated from external attack by various forces such as X-rays.

Based on the aforementioned reliability assessments, a specific self-calibrating and self-repairing system "tool box" may include a number of "spare parts" necessary to ensure autonomous and continuous operation of the apparatus. The type and number of components contained in the "tool box" may not be the same for each identified area of the DAS. In general, it may be expected that a lesser number of "spare parts" components may be required in the "tool box" where external factors have less direct impact on the various sections in the DAS. In addition, radiation effects (such as single-event upsets and dose radiation) should be considered in determining the reliability factors for each section of the DAS. Areas with a higher probability of external abuse (by a user or the environment) may be stocked with a greater number of spare components as compared to those areas physically protected against abuse of the DAS. The spare components are completely interchangeable, and may replace any failed component of its type, regardless of location within the DAS. Failed and/or degraded components are electronically removed from their operating systems and disabled, thereby reducing power consumption. The present invention autonomously and automatically electronically replaces the failed and/or degraded components with spare component parts from the stock of spare component parts.

Figure 1:
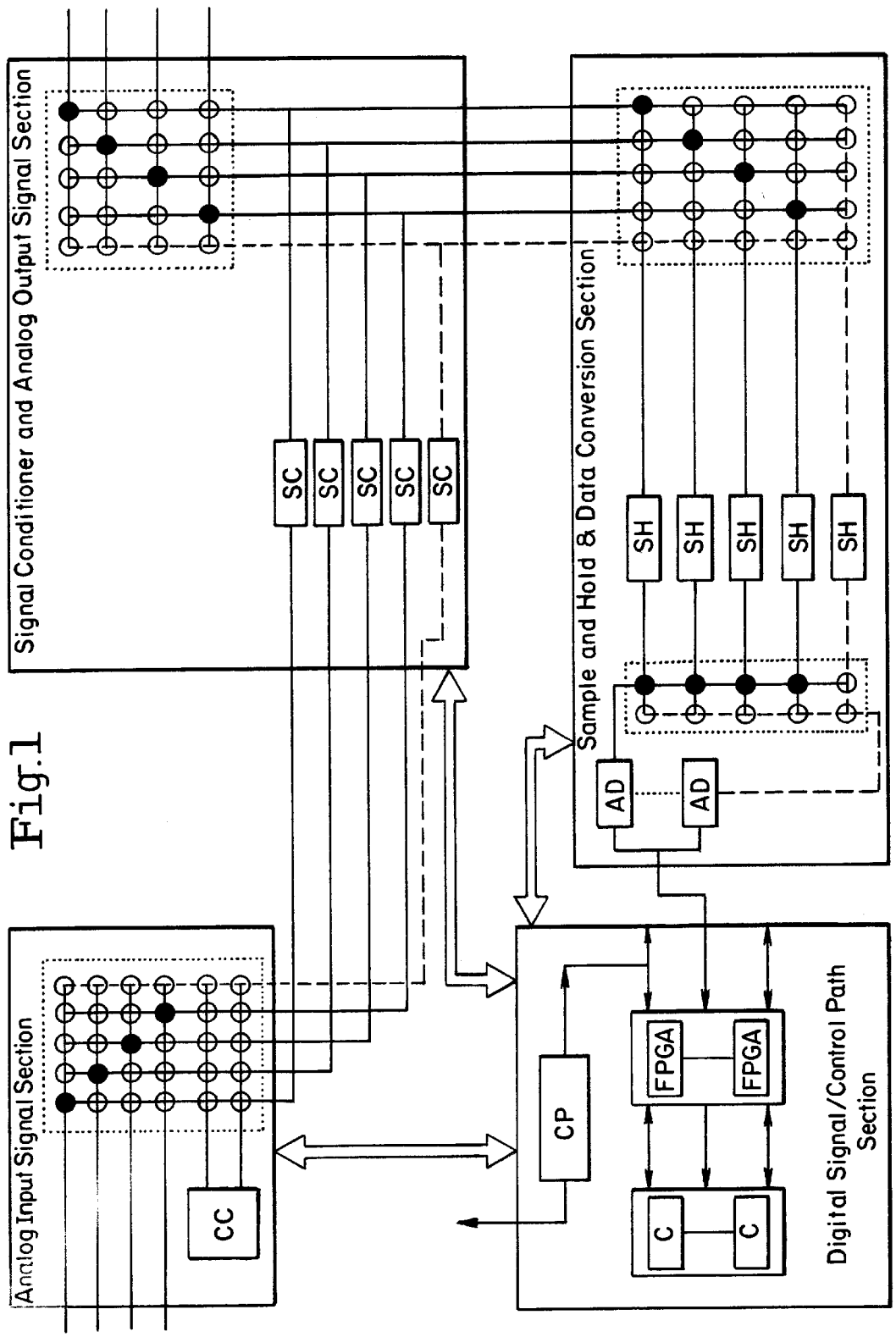
FIG. 1 shows a schematic view of a self-calibrating and self-repairing system formed in accordance with the present invention.

The self-calibrating and self-repairing system utilized in the present invention is illustrated in FIG. 1, and clearly shows four sections of the "spare parts-tool box" system for the DAS including the unique self-calibration, self-configuration and self-repair capabilities of the present invention. The four sections further include an analog input signal section; a signal conditioner and analog output section; a sample-and-hold and data conversion section; and a digital signal/control path section. The various sections of the DAS are connected to one another via several internal/external data buses, and the entire circuitry is user configurable. The architecture of the self-calibrating and self-repairing system comprising the present invention will know be discussed in greater detail.

Figure 1A:
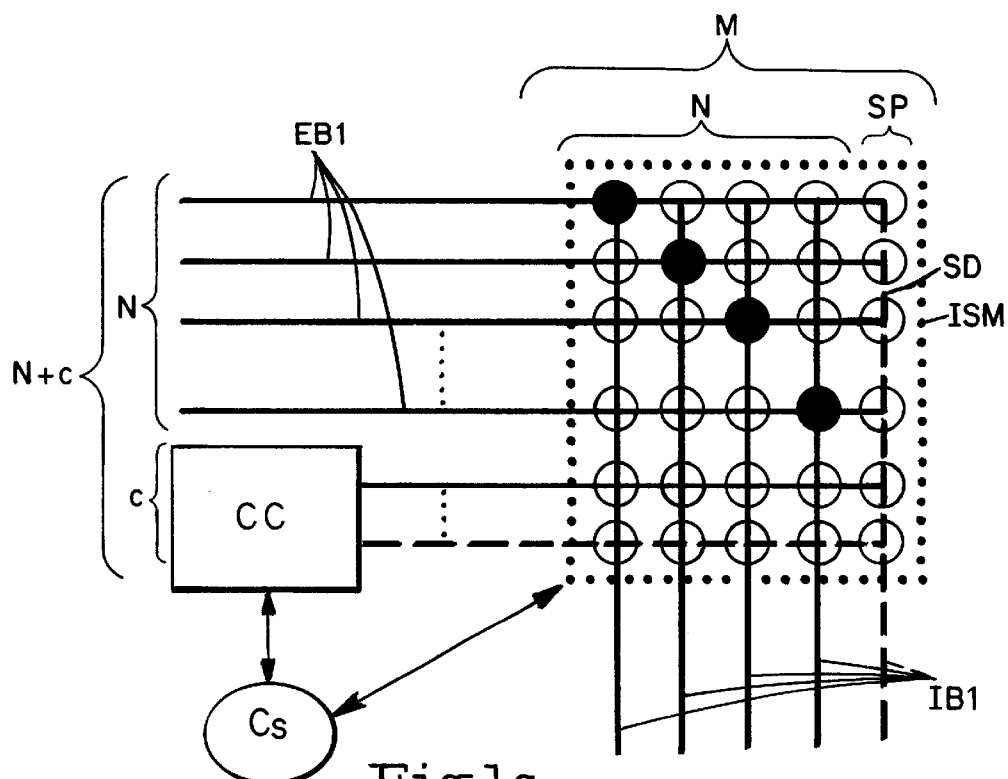
FIG. 1(a) shows a schematic view of the Analog Input Signal Section of the present invention shown in FIG. 1.

FIG. 1(a) shows the Analog Input Signal Section of the overall self-calibrating and self-repairing system of the present invention. A series of analog input signals are shown as an External Bus (EB1). The number of analog signal inputs (N) per system corresponds to the number of measurements taken by the particular type of DAS. These signal inputs are connected to the analog Input Switch Matrix (ISM) available to the user.

In addition, one or more inputs are provided to facilitate autonomous self-calibration, wherein the number of calibration inputs is identified as (c). As with the analog signal inputs (N), the Calibration Circuits (CC) are connected to the ISM. Because the CC are internally controlled by the DAS, they are not available for control by the user.

The CC provide real-time, continuous and autonomous calibration verification of the analog channels. This feature may be used in conjunction with the ISM and the analog signal conditioners (not shown) in determining whether signal health and accuracy are within acceptable, specified limits for the DAS. If not, the Controller (C), i.e., microcontroller, micro-processor or digital signal processor, will set an alternate path within the DAS that meets these requirements, using one of the internal Spare Data (SD) lines connected to one of the Spare Parts (SP). The SD lines remain passive until an alternate path is needed, at which time they connect to the Internal Bus (IB1).

The ISM is individually accessible and is responsible for connecting the Number of analog signal inputs (N) to the IB1, whereby the raw data may be sent to the signal conditioners, not shown.

The IB1 has M lines, where:

$$M = N + SP;$$

where

N=Number of analog signal inputs

SP=Number of spare parts specified for this area

The ISM has an order of (N+c)×M (where c=one or more self-calibration inputs) to facilitate the connection of any individual external input to any of the signal conditioners, not shown. Matrix switch configuration at any specific time is defined and controlled by the controller, not shown.

Analog switch matrices are used throughout the analog path of the DAS. The present invention offers the flexibility to reconfigure any section of the analog circuitry based on its operating health. The analog switch matrix configuration allows external and internal bus lines to be real-time configured by the controller to provide alternate paths for any analog signal.

Figure 1B:
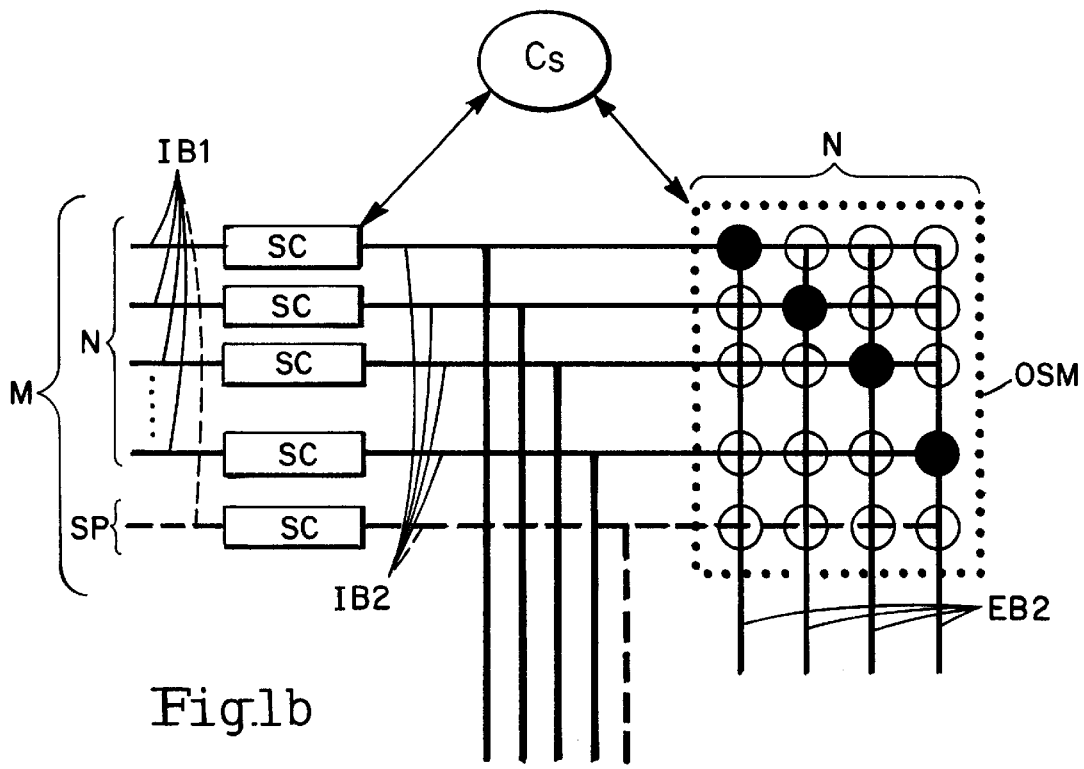
FIG. 1(b) shows a schematic view of the Signal Conditioner and Analog Output Signal Section of the self-calibrating and self-repairing system of the present invention shown in FIG. 1.

FIG. 1(b) shows the signal conditioner and analog output signal section of the self-calibrating and self-repairing system. In order to fully utilize the flexibility provided by the analog switch matrix configuration, the capability to configure the analog signal conditioners to the specific requirements of each analog line in real time is needed. Commercially available analog signal conditioners may be used, provided they are capable of being reconfigured in real time using a controller. The analog signal conditioner may have a preamplifier section with user-adjustable gain, a filter section that is definable by the user, and an output stage with user-adjustable gain. By using this capability, the "tool box" in the system provides interchangeable analog signal conditioner spare parts (SP) that may be incorporated in the circuit and immediately reconfigured to provide the desired signal integrity.

There are M signal conditioner (SC) modules that are responsible for processing the raw data of the N Number of analog signal inputs, which are received via the IB1. M=N (number of Number of analog signal inputs)+SP (number of specified "spare parts" in the "tool box" for this area). Signal conditioners are selected, configured, monitored, and, in the event of a problem, electronically removed from the operating system by the C. The SP of the "tool box" is not utilized by the system until a specific need arises, e.g. component failure and/or degradation.

Once the raw data is received, the SC modules convert the raw data into conditioned data and send it out on a Second Internal bus (IB2) which is connected to the outputs of each of the SC modules and has responsibility for bringing the conditioned signals to the Output Switch Matrix (OSM) as well as to the Sample-and-Hold area of the system, not shown.

The OSM is responsible for connecting the IB2 to the user's accessible output lines, not shown, which is an External Bus (EB2). The OSM has a similar configuration to the ISM shown in FIG. 1a. However, the OSM has an order of N×M, where:

$$M=N+SP;$$

N=Number of analog signal outputs; and
SP=Number of spare parts specified for this area The OSM is controlled by the DAS, and each switch is individually set or reset based on the controller's decision.

Figure 1C:
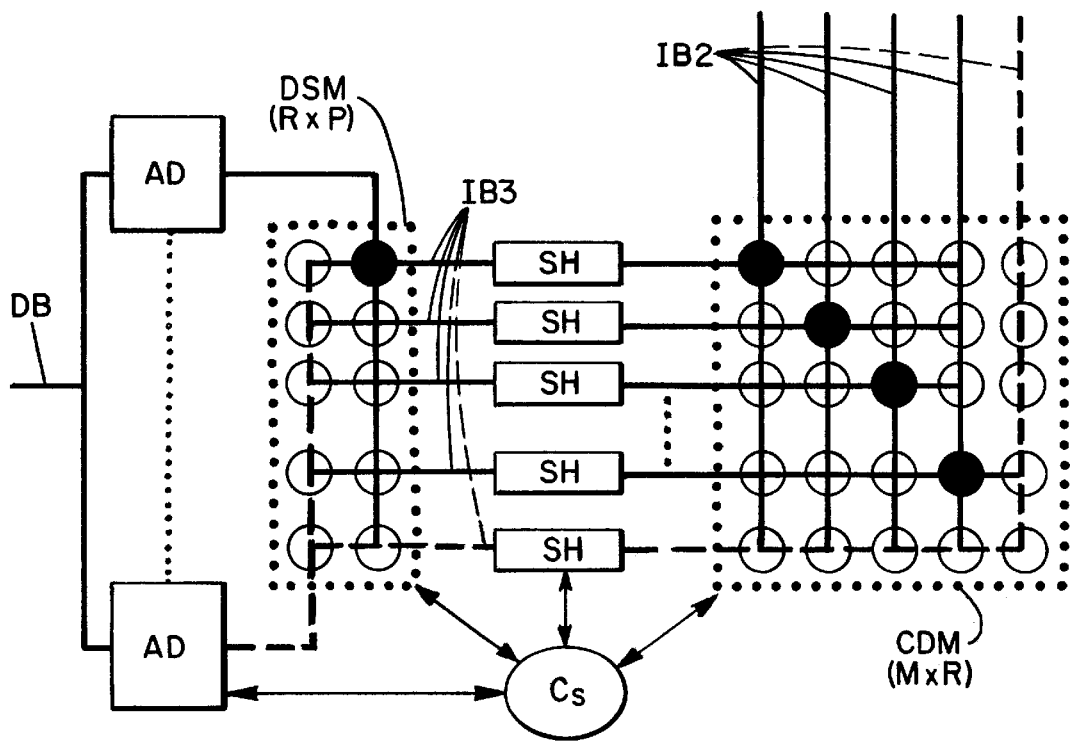
FIG. 1(c) shows a schematic view of the Sample and-Hold and Data Conversion Section of the self-calibrating and self-repairing system of the present invention shown in FIG. 1.

The IB2 possessing the conditioned analog data is also connected to the Sample-and-Hold section ($SH_s$) of the DAS through the Conditioned Data Matrix (CDM). AS shown in FIG. 1(c), it provide the desired synchronous sampling capability of the present invention.

The dimensions of the CDM are based on the number (M) of primary and "spare part" signal conditioners as well as the number (R) of primary and "spare part" Sample-and-Hold circuits (SH). The number R is developed from the following:

$$R=N+SP2;$$

where
N=number of Number of analog signal inputs
SP2=number of "spare parts" specified for this area It should be noted that R is not required to be the same as M. The numbers R and M are derived from the reliability studies of each individual section of the DAS.

The CDM passes the conditioned data to the $SH_s$, where it is simultaneously sampled at a specified sampling rate and held in each of the individual (SH) channels. Output from each of the (SH) channels is then routed sequentially to the Analog-to-Digital Converter Section ($AD_s$ for data digitization via a Third Internal Bus (IB3).

Routing the signal to the Data Conversion section from the $SH_s$ section is accomplished using the Digitizing Switch Matrix (DSM), which is an analog switch matrix. The DAS has the flexibility to select and match any input to any output. The dimensions of the DSM are calculated as R×P, where:

$$R=N+SP3;$$

where
N=number of Number of analog signal inputs
SP3=number of "spare parts" specified for this area; and
P=the number of Analog-to-Digital Converters necessary The number of Analog-to-Digital Converters P in the DAS may also be derived from the calculated reliability factor for that section. Once the data is digitized, it is then sent to the digital signal/control path section via a Digital Bus (DB).

Figure 1D:
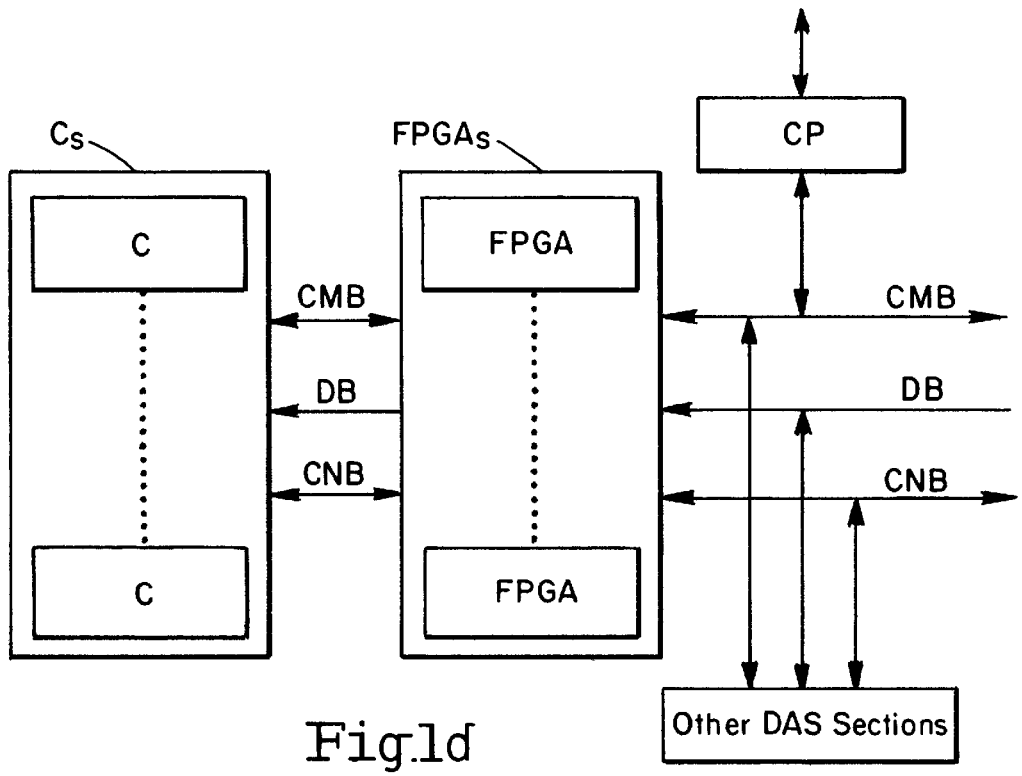
FIG. 1(d) shows a schematic view of the Digital Signal/Control Path Section of the self-calibrating and self-repairing system of the present invention shown in FIG. 1.

FIG. 1(d) illustrates the digital signal/control path section of the self-calibrating and self-repairing system. This section provides control, monitoring and processing of several digitized signals. This section also provides redundancy control and monitor for critical system functions as defined by the user. It is designed for low power consumption, including the implementation of a "sleep model" in the firmware, which is designed to conserve power whenever possible. The digital signal/control path section also monitors the health of the system by processing defined measurements and/or trends. It will autonomously and automatically make adjustments to the system for channel failures, temperature compensation and calibration.

The basic architecture of the digital signal/control path section includes at least one programmable digital switch matrix which may take the form of one or more Field Programmable Gate Arrays (FPGA), collectively shown as the FPGA section (FPGA). The actual number of FPGA is determined by the failure probability of the components in the "spare parts-tool box" system, redundancy control, and redundancy requirements of the digital signal/control path section.

Data is sent to the FPGA, from the Sample-and-Hold & Data Conversion Section via the DB. The FPGA then provides digital switching for multiple signal paths. The digital switches are re-configurable to route signal paths to their appropriate destinations. The configuration of the switches is automatically and autonomously controlled by the processor or internal logic within the FPGA. The FPGA is not limited to switching digital signals, and is also programmable to perform signal processing, control and support processor functions.

The $FPGA_s$ operates in conjunction with one or more controllers C, which are collectively shown as the controller section (C). Here, as in for the $FPGA_s$, the actual number of C is also determined by the probability of electronic failure and/or degradation of the "spare part-stool box" components, redundancy control and redundancy requirements of the digital signal/control path section.

The controller C monitors, controls and processes the digitized input signals. The $FPGA_s$ and $C_s$ both receive data from the DB and work in tandem to process the digitized information. The C includes a Communication Interface (SCI) and Peripheral Interface (SPI); Joint Test Action Group (JTAG) Interface for online debugging and Flash programming and Flash memory for storing programs and data. In instances where the number of controllers C is greater than one, a primary and secondary(s) controllers C are designated. If one C fails, another controller C assumes the tasks of the failed controller. These controllers C periodically communicate with one another to perform self-checks.

The digital signal/control path section provides an external communication port (CP). The CP is connected to both the $FPGA_s$ and $C_s$ via a Communications Bus (CMB) protected from spurious voltage spikes caused by connection/disconnection. The CP may utilize serial communication, wireless communication, optical communication or any other communication mode(s). The CP may also be connected with a Graphic User Interface (GUI), not shown, for communication between the user and the DAS.

The digital signal/control path section also provides a link to the main system via a Control Bus (CNB). As with the CMB, the CNB is connected to both the $FPGA_s$ and $C_s$, and both systems work in conjunction to send data to the system.

The firmware of the digital signal/control path section monitors input signals, controls the output lines and performs signal processing when necessary. The firmware also detects signal path failures and performs self-repairs; performs periodic calibrations on the analog module; automatically detects system degradation and potential failures; controls the analog switches; provides a communication interface with the FPGA for downloading FPGA programs; provides external interface to a PC; provides digital signal processing; and provides a reset capability for the digital signal/control path section.

Figure 2:
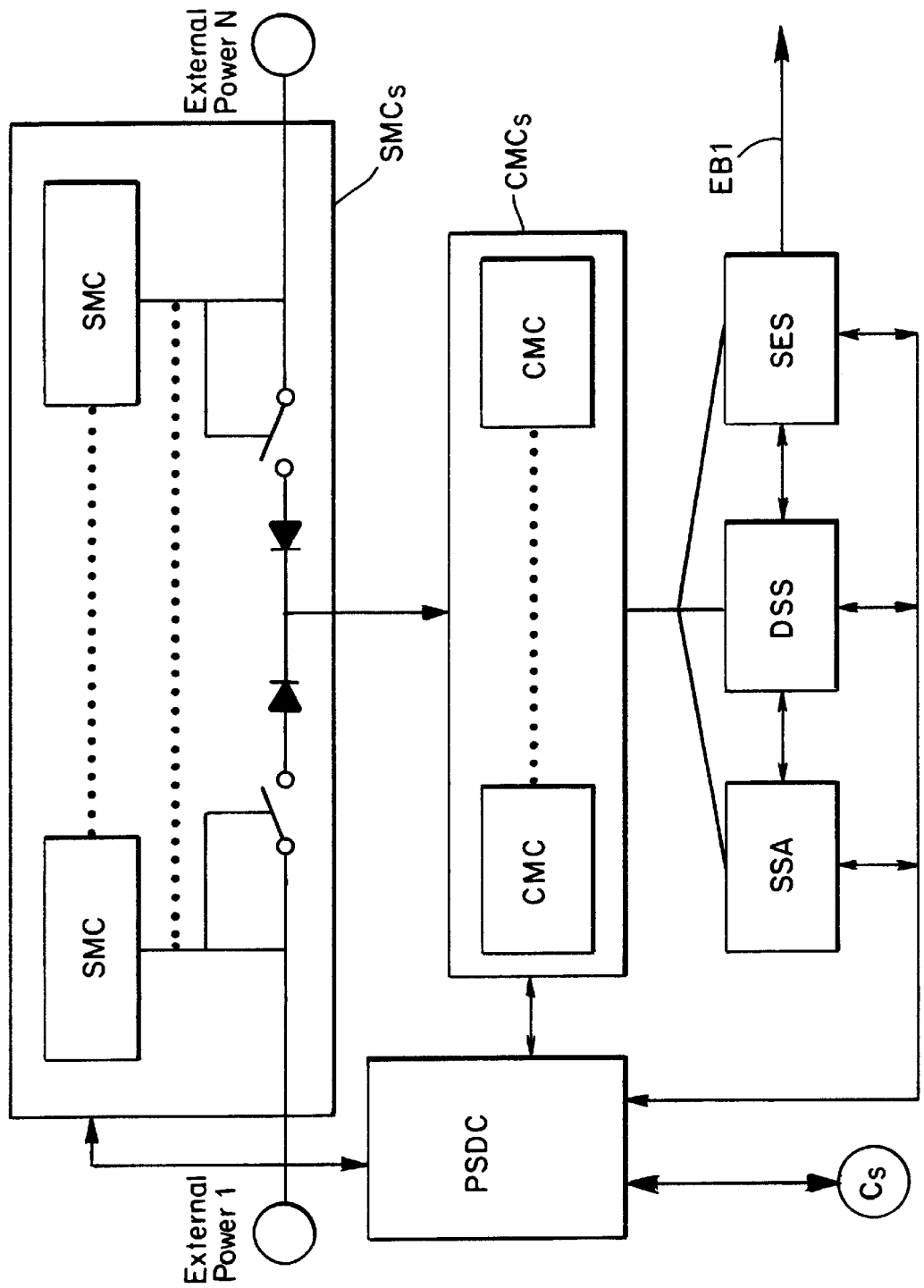
FIG. 2 shows a schematic view of the Power Management Control Section of the self-calibrating and self-repairing system of the present invention shown in FIG. 1.

FIG. 2 is a schematic illustration showing the Power Management Section, which provides the self-calibrating and self-repairing system with sufficient redundancy as well as reduced power consumption capabilities. It includes one or more Supply Monitoring Circuits (SMC), one or more Current Monitoring Circuits (CMC) and a Power Supply Dedicated Controller (PSDC).

The SMC are collectively known as the Supply Monitoring Circuit Section ($SMC_s$). The actual number of $SMC_s$ is determined by the components, redundancy control and redundancy requirements of the system. The $SMC_s$ allow the system to switch between a primary and a redundant power source to prevent power loss during operation. The $SMC_s$ also provide additional power monitoring capabilities including over-voltage and over-current monitoring and protection, surge and transient protection, and noise monitoring and filtering.

The CMC preferentially includes a number of electronic switches. However, any mode or device capable of operating the CMC may be utilized, provided that the system operates within desired parameters. The CMC also provides health status and power management capabilities to the sections identified in FIGS. 1, 1(a), 1(b), 1(c) and 1(d), respectively. These include the analog Signal Section (SSA) and the Digital Signal Section (DSS). It is also connected to the Sensor Excitation Section (SES), which, in turn, is connected to external sensors. Closed monitoring of current profiles of each of these sections provides information on system failure or degradation as well as power management capabilities by allowing individual power on/off switching of components.

As shown in FIG. 2, the PSDC provides monitoring and control capabilities for the different sections of the SSA, DSS and SES, as well as the $SMC_s$. The PSDC also provides an independent assessment of the main processor's health by monitoring specific parameters, such as current consumption and performs a periodic scheduled communication. The PSDC can reset the system if conditions indicate that the main processor(s) have failed.

Although the present invention has been disclosed in terms of a preferred embodiment, it will be understood that numerous modifications and variations could be made thereto without departing from the scope of the invention as defined in the following claims.

What is claimed is:

1. A Data Acquisition System (DAS) having a number of components, and capable of self-calibration and self-repair, comprising;

a number of spare-part components and a number of operational components all housed within said DAS;

the spare part components of the DAS being interchangeable with operational components of the DAS;

the number of said spare-part components being pre-selected to electronically replace those operational components statistically predicted by reliability parameters more likely than not to fail or degrade during operation of the DAS; and the spare part components being further disposed to automatically, autonomously and electronically replace those operational components upon their failure and/or degradation;

thereby assuring continuous operation of said DAS.

2. A self-calibrating and self-repairing Data Acquisition System (DAS), comprising:

an analog input signal section;

a signal conditioner and analog output signal section;

a sample-and-hold and data conversion section;

a digital signal and control path section;

a number of operational components;

with at least some of said analog input signal section, said signal conditioner and analog output signal section, and said sample-and-hold and/or data conversion sections having a number of spare part components housed within said DAS;

the number of said spare-part components being pre-selected to electronically replace those operational components statistically predicted by reliability parameters more likely than not to fail or degrade during operation of the DAS;

the spare-part components being interchangeably disposed with the number of operational components in each section, with the spare-part components further disposed so as to automatically and autonomously electronically replace the operational components upon their failure and/or degradation;

said analog input signal section being further connected to said signal conditioner and analog output signal section through internal circuits;

said signal conditioner and analog output signal section connected to said sample-and-hold and data conversion section through internal data circuits;

said sample-and-hold and data conversion section connected to said digital signal control path section through internal data circuits;

thereby assuring continuous operation of all DAS sections upon failure and/or degradation of any operational component.

3. The DAS system of claim 2, wherein the number of said spare-part components being pre-selected to electronically replace those operational components are statistically predicted by quantification of reliability parameters utilizing Mean Time Between Failures (MTBF) guidelines.

4. The DAS system of claim 3, wherein said analog input signal section further comprises a plurality of analog signal inputs, said plurality of analog signal inputs comprising a first external bus; said external bus connected to a matrix of analog switches.

5. The DAS system of claim 4, wherein said analog input signal section further comprises at least one supplemental signal input, a calibration circuit and a controller, with said supplemental signal input being connected to calibration circuits, and to said matrix of analog switches;

with said controller being disposed to determine whether said DAS is operating within parameters;

with said controller further being connected to said calibration circuits and said matrix of analog switches; and with said controller further being disposed to connect spare data lines of said spare-part components to said DAS when the operative components of the analog input section fail.

6. The DAS system of claim 5, wherein said analog input section further comprises:

a first internal bus including a plurality of lines, the matrix of analog switches connecting the first external bus and the supplemental signal input to said first internal bus;

wherein said plurality of lines is determined by the plurality of analog signal inputs and said number of spare parts specified for said analog input signal section.

7. The DAS system of claim 6, wherein the signal conditioner and output analog signal section further comprises:

at least one signal conditioner module, with said first internal bus further being connected to said module.

8. The DAS system of claim 7, further includes a second internal analog signal bus, wherein said signal conditioner module receives raw data from said first internal bus, with said module converting the raw data to conditioned data; and said second internal analog signal bus further disposed to transmit said conditioned data.

9. The DAS system of claim 8, wherein said second internal analog signal bus further includes a plurality of lines, with the number of lines determined by said plurality of analog signal inputs and said spare parts specified for said analog input signal section.

10. The DAS system of claim 9, wherein said signal conditioner and output signal section further include an output signal switch matrix, with said second internal analog signal bus connecting to said output signal switch matrix;

said output signal switch matrix controlled by said system;

said controller further disposed to select, configure and monitor said module; and said controller further disposed to replace failed said module with said spare part.

11. The DAS system of claim 10, wherein said sample and hold and data conversion section further comprises a conditioned data matrix, with said second internal analog signal bus further connecting to said sample-and-hold and data conversion section through a second external bus line;

wherein said section receives data from said second internal bus line through said conditioned data matrix.

12. The DAS system of claim 11, wherein said conditioned data matrix further comprises a plurality of primary and a plurality of spare-part signal conditioners.

13. The DAS system of claim 12, wherein said sample and hold and data conversion section further comprises a plurality of output lines connected to said conditioned data matrix, with said conditioned data matrix sequentially routing said outputs to said sample and hold and data conversion section disposed to connect to a third internal analog bus for transmitting said conditioned data from said sample-and-hold and data conversion section to said digital signal and control path section via a digital switch matrix.

14. The DAS system of claim 13, wherein said sample-and-hold and data conversion section further comprises at least one analog-to-digital converter connected to said digital switch matrix through the third internal bus; with the third internal bus disposed to transmit data to said analog-to-digital converter for converting said data from analog to digital format.

15. The DAS system of claim 14, wherein said digital signal and control path section further comprises at least one programmable digital switch matrix including a programmable digital switch matrix section; the programmable digital switch matrix disposed to operate in conjunction with at least one processor, wherein the data is transmitted from said analog-to-digital converter to said programmable digital switch matrix and said processor through a digital bus.

16. The DAS system of claim 15, wherein said digital signal and control path section further comprises an external communication assembly, including a communication port disposed to transmit data from the programmable digital switch matrix and the processor through a communication bus; with the communications port being disposed to transmit data using the communication assembly.

17. The DAS system of claim 16, wherein said communication assembly further comprises serial communication, wireless communication, and optical communication members.

18. The DAS system of claim 17, wherein said digital signal and control path section further comprises a control bus connected to both said programmable digital switch matrix and said processor; wherein said control bus is further connected to said DAS system.

19. The DAS system of claim 18, wherein said digital signal and control path section further comprises firmware disposed to control output lines and perform signal processing.

20. The DAS system of claim 19, further comprising a power management section having at least one supply monitoring circuit connected to at least one current monitoring circuit and a power supply dedicated controller;

with said power supply dedicated controller connected to said analog signal input section and said digital signal section; and said power management section further comprising a sensor excitation section connected to said power supply dedicated controller and connected to said analog signal input section and further connected to said digital signal section.

21. The DAS system of claim 20, wherein said power management section further comprises noise monitoring and filtering apparatus for controlling operation of said DAS system.

22. The DAS system of claim 21, wherein said supply monitoring circuit further comprises over voltage and under voltage monitoring apparatus for preventing power loss during operation; with the monitoring apparatus disposed to enable and disable said power supply based upon bus health status.

23. The DAS system of claim 20, wherein said current monitoring circuit further comprises over-current detection apparatus for detecting malfunctions in said DAS system.

24. The DAS system of claim 23, wherein said power supply dedicated controller further comprises an independent assessment apparatus for monitoring parameters in said DAS system.

25. A method for self-calibrating and self-repair of a Data Acquisition System (DAS) comprising the steps of:
   (i) determining the number of spare-part components pre-selected to electronically replace those operational components statistically predicted by reliability parameters more likely than not to fail or degrade during operation of the DAS;
   (ii) providing said DAS with electronic access to said statistically predicted number of spare part components; and
   (iii) automatically, autonomously and electronically replacing those failing or degrading operational components with said spare part components;
   (iv) thereby assuring continuous operation of the DAS system.

26. The method of self-calibrating and self-repairing a Data Acquisition System (DAS) comprising the steps of:
   (i) determining the number of spare-part components pre-selected to electronically replace those operational components statistically predicted by reliability parameters more likely than not to fail or degrade during operation of the DAS;
   (ii) positioning said predetermined number of spare-part components in said DAS;
   (iii) automatically, autonomously and electronically replacing failing or degrading operational components with said spare part components;
   (iv) continuously operating said DAS during failure and electronic replacement of the operational components with the spare-part components;
   (v) connecting an analog input signal section to a signal conditioner and analog output signal section, a sample-and-hold and data conversion section and a digital signal and control path section;
   (vi) transmitting a plurality of analog signals to a matrix of analog switches;
   (vii) transmitting at least one supplemental analog signal to said matrix;
   (viii) verifying calibration of said analog signals with calibration circuits and a controller;
   (ix) connecting said analog signals to an internal bus;
   (x) transmitting raw data from said analog signals to said internal bus;
   (xi) transmitting said raw data to at least one conditioner module of said signal conditioner and analog output signal section;
   (xii) converting said raw data to conditioned data in said conditioner module;
   (xiii) transmitting said conditioned data from said conditioner module through a second internal analog signal bus to an output signal switch matrix;
   (xiv) transmitting said conditioned data from said conditioner modules through said second internal analog signal bus and a conditioned data matrix to said sample-and-hold and data conversion section;
   (xv) sampling said conditioned data in at least one channel of said sample-and-hold and data conversion section;
   (xvi) holding said data at specific intervals in at least one channel of said sample-and-hold and data conversion section; and
   (xvii) sequentially transmitting output signals from said sample-and-hold and data conversion section through a third internal analog bus to said digital signal and control path section, via a digitizing switch matrix, and a digital bus.

* * * * *